US007502478B2

(12) United States Patent
King

(10) Patent No.: US 7,502,478 B2
(45) Date of Patent: Mar. 10, 2009

(54) STEREO AUDIO HEADSET INTERFACE AND METHOD THAT IS COMPATIBLE WITH MONO HEADSETS

(75) Inventor: Jay King, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 845 days.

(21) Appl. No.: 10/718,835

(22) Filed: Nov. 21, 2003

(65) Prior Publication Data

US 2005/0111670 A1 May 26, 2005

(51) Int. Cl.
H03G 11/00 (2006.01)

(52) U.S. Cl. .............................. 381/55; 381/74; 381/11; 381/309

(58) Field of Classification Search .................. 381/74, 381/309, 370, 384, 1, 11, 55
See application file for complete search history.

(56) References Cited

U.S. PATENT DOCUMENTS

| | | | | |
|---|---|---|---|---|
| 4,433,209 | A * | 2/1984 | Kurosawa et al. | 381/1 |
| 5,642,424 | A * | 6/1997 | Masaki | 381/309 |
| 5,655,025 | A * | 8/1997 | Kim et al. | 381/11 |
| 6,711,268 | B2 * | 3/2004 | Colegrave et al. | 381/74 |
| 6,928,176 | B2 * | 8/2005 | Lin et al. | 381/123 |

* cited by examiner

*Primary Examiner*—Vivian Chin
*Assistant Examiner*—Jason R Kurr

(57) ABSTRACT

A stereo headset interface that is compatible with mono for an audio playback device. A load in series between an audio output from a stereo headset driver and a ground of a mono headset plug prevents the audio output from being grounded when a mono headset plug is inserted into the stereo headset jack of the playback device. A second load in series between a second audio output and the mono headset plug balances the first and second audio outputs from the stereo headset driver.

11 Claims, 2 Drawing Sheets

STEREO AUDIO HEADSET INTERFACE AND METHOD THAT IS COMPATIBLE WITH MONO HEADSETS

BACKGROUND OF THE INVENTION

1. Field of the Invention (Technical Field)

The present invention relates to the field of audio headsets, in particular to the field of mono and stereo headset interface with audio playback devices.

2. Background Art

Audio playback devices including radios, cassette tape players, compact disc players, digital audio tape players, and the like, are used to produce acoustic signals from prerecorded audio and broadcasted audio information. Depending upon the output configuration of the playback device and the recording format, audio information is output from the audio playback device in either mono or stereo format. Other audio formats are available but are not discussed here. A mono formatted recording provides audio information on a single mono channel, while a stereo formatted recording provides different audio information on each of multiple channels, typically left and right. The result of audio information recorded in a stereo format is that the user perceives a broader spaced sound that more accurately reproduces the sound from a live performance. Audio output from audio playback devices is sent to a speaker or speakers integral to the device, speakers remotely located from the device, or from speakers that are in close proximity to a listener's ears, commonly referred to as headsets or headphones.

When an audio playback device operating in stereo mode is connected to a stereo headset having left and right outputs, a stereo headset driver associated with the audio playback device provides the amplification necessary to drive the speakers in the headset. The headset is connected to a headset plug having electrically-isolated conductors for audio left, audio right, and ground, and a microphone input if the headset is equipped with a microphone for communication input to the playback device. A microphone input would be appropriate if the playback device is, for example, a mobile communication device, such as a cellular telephone. The headset plug fits into a mating headset jack located on the audio playback device. The headset jack interfaces with the audio left, audio right, ground and microphone inputs from the headset.

Typically a single power supply configuration supplies power to the headset driver of the audio playback device, resulting in a DC voltage level at the left and right outputs of the driver between ground and the single supply. For that reason, DC blocking capacitors are placed on the audio left and audio right signals between the headset driver and headset jack to filter the DC voltage from the signal.

When the stereo audio playback device is used to drive a mono headset, such as when a mono headset is plugged into the stereo headset jack of the playback device, the audio right signal is shorted to ground through the ground conductor of the mono headset plug. This occurs because the mono headset plug has just three conductors, ground, audio left, and microphone. When plugged into the stereo headset jack of the playback device, the microphone, ground and audio left interfaces of the headset jack align properly with those of the headset plug, but the audio right interface from the headset jack contacts the ground portion of the headset plug. Thus, when a mono headset plug is plugged into a stereo headset jack, excessive electrical current is drawn from the power supply by the headset driver because one of the audio outputs is grounded instead of being connected to the proper impedance load. This results in excessive heating of the headset driver and possible damage to the headset driver. For this reason audio playback devices that provide stereo output through a stereo jack are not compatible with standard mono headsets.

Devices used for wireless communication, including mobile cellular and satellite telephones, pagers, personal digital assistants (PDAs), and the like (hereafter "mobile communication devices") conventionally provide mono playback of audio information. Headsets having a speaker sized for placement in the vicinity of the left or right ear of a user are often employed in conjunction with mobile communication devices to accommodate "hands-free" communication. The speaker is typically connected via a hard-wire connection to the mobile communication device through a headset jack on the device. As mobile technology advances, mobile communication devices will provide stereo audio output. A mobile configured to provide stereo audio output will not be compatible with existing standard mono headsets due to the incompatibility of mono headset plugs to stereo headset jacks.

It would be advantageous if a headset interface of an audio playback device that outputs stereo formatted audio information was compatible with both stereo and mono headsets. Such an interface would provide the user the capability to use standard mono headsets with audio playback devices that output stereo audio.

SUMMARY OF THE INVENTION (DISCLOSURE OF THE INVENTION)

A primary object of the present invention is to provide a headset interface that is compatible with either a stereo or a mono headset. Another primary object of the present invention is to prevent excessive electrical current draw from a power supply of the playback device when a mono headset is plugged into the headset jack of the playback device.

The present invention is a stereo headset interface that is compatible with mono for an audio playback device. A load in series between an audio output from a stereo headset driver and a ground of a mono headset plug prevents the audio output from being grounded when a mono headset plug is inserted into the stereo headset jack of the playback device.

A primary advantage of the present invention is that a conventional mono headset can be used with a stereo audio playback device. Another primary advantage of the present invention is that a mono headset used with a stereo playback device will not cause overheating or damage to the playback device.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate different embodiments of the present invention and, together with the description, serve to explain the principles of the invention. The drawings are only for the purpose of illustrating these embodiments of the invention and are not to be construed as limiting the invention. In the drawings.

DESCRIPTION OF THE PREFERRED EMBODIMENTS

Best Modes for Carrying Out the Invention

Figure 1:
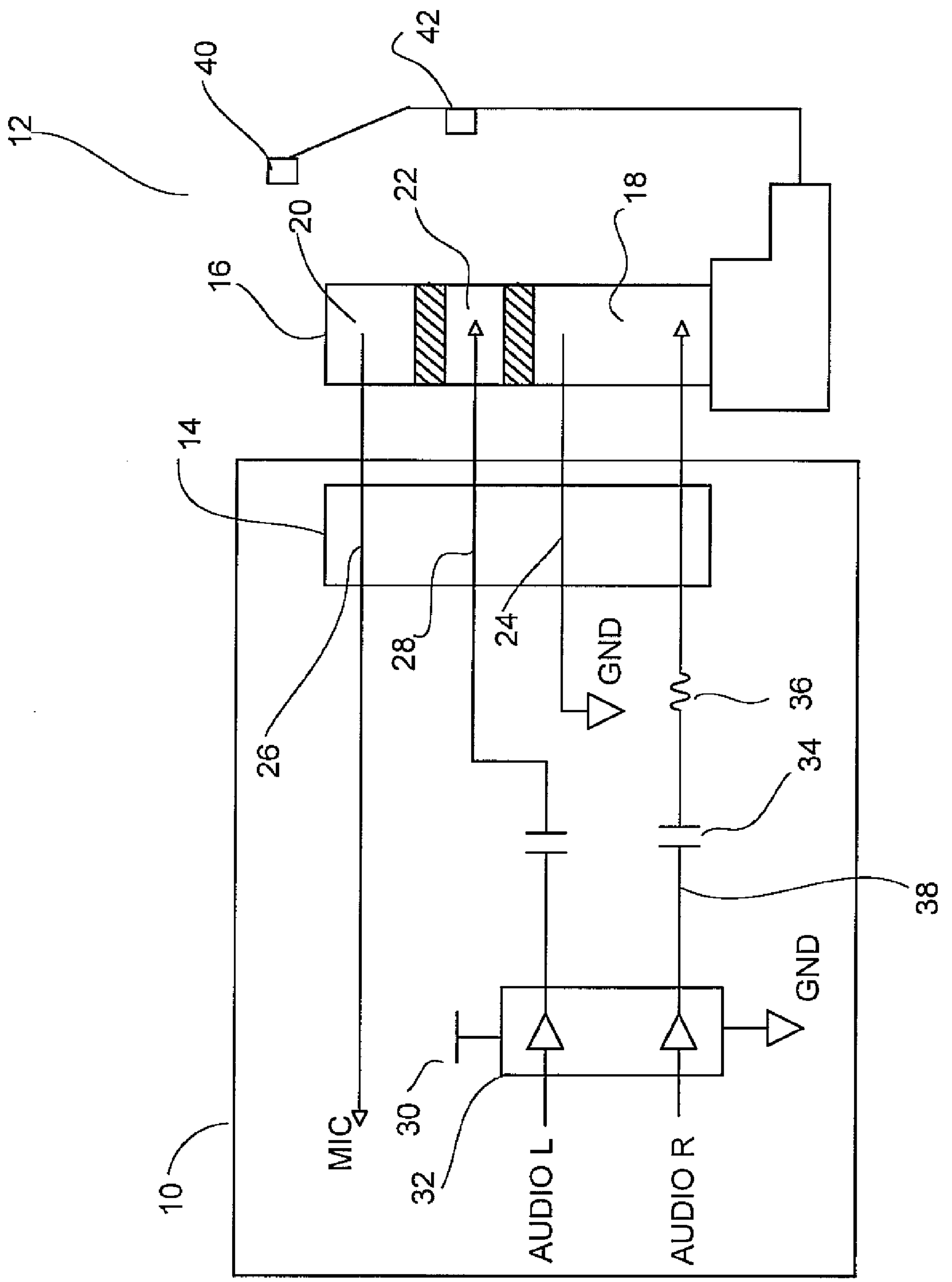
FIG. 1 is a schematic diagram of a first embodiment of the present invention for a stereo headset interface that is compatible with mono for an audio playback device.

The present invention is a method and apparatus for allowing a stereo audio playback device to be input to a mono headset without excessive power drain to the headset driver. Referring to FIG. 1, a schematic diagram of the present invention for a stereo headset interface that is compatible with mono is shown in an audio playback device that outputs stereo audio. Playback device 10 is in communication with a mono headset 12 when headset plug 16 of mono headset 12 is plugged into headset jack 14 of playback device 10. Mono headset speaker 40 and microphone 42 are shown on headset 12.

Mono headset plug 16 comprises electrically-isolated ground conductor 18, microphone conductor 20, and audio conductor 22. When plugged into headset jack 14, ground conductor 18 is in contact with ground 24 of headset jack 14, microphone conductor 20 is in contact with microphone input 26 of headset jack 14, and audio conductor 22 is in contact with audio left output 28 of headset jack 14. The audio signal from the audio right output of stereo headset driver 32 is in contact with ground 18 of headset plug 16 due to the configuration of the mono headset plug 16.

Power supply 30 provides power to stereo headset driver 32 which provides audio amplification for the audio signal to headset 12. Blocking capacitors 34 filter DC voltage from headset driver 32. Resistance 36 is located in the signal path between headset driver 32 and headset jack 14 so that audio right output 38 from headset driver 32 passes through resistance 36 prior to being output through headset jack 14 to headset plug 16. It will be understood by those of skill in the art that resistance 36 can alternatively be located in the signal path of audio left output 28 from headset driver 32, should the configuration of the mono headset plug be such that audio left contacts ground upon being plugged into the headset jack, instead of audio right.

Resistance 36 prevents or reduces damage to headset driver 32 by providing a load to audio right output 38 preventing audio right output 38 from directly contacting ground 18. The value of resistance 36 is equal to or greater than the minimum impedance or resistance that headset driver 32 is configured to drive. Audio left 28 drives mono headset speaker 40.

When a stereo headset is plugged into headset jack 14 of audio playback device 10, the amplitude of audio right output 38 is increased to compensate for the reduced power received by the right speaker of the stereo headset due to resistance 36 in the signal path.

Figure 2:
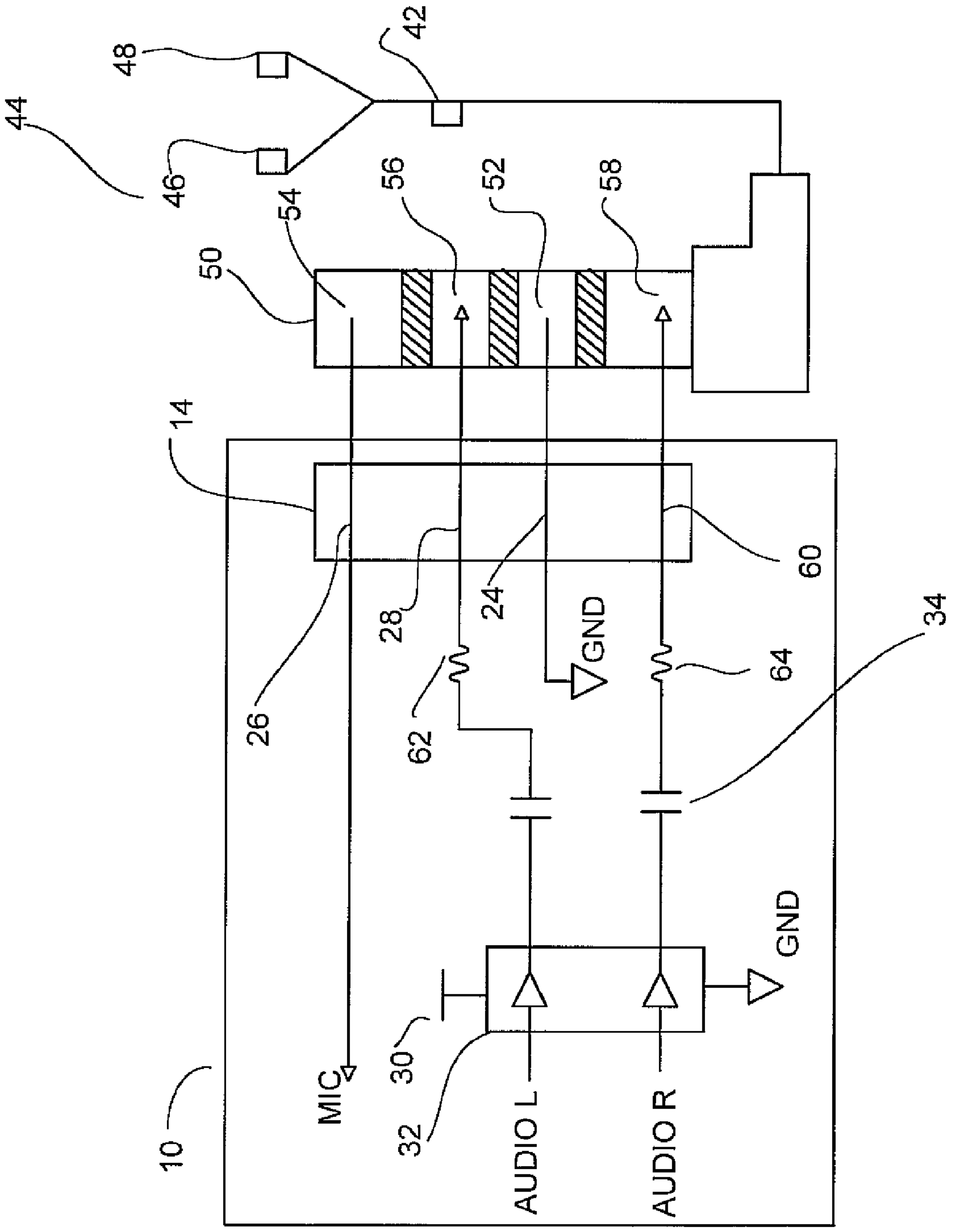
FIG. 2 is a schematic diagram of a second, preferred embodiment of the present invention for a stereo headset interface that is compatible with mono for an audio playback device.

Referring to FIG. 2, a schematic diagram of a second, preferred embodiment of the present invention for a stereo headset interface that is compatible with mono is shown. FIG. 2 shows the invention in operation when connected to a stereo headset 44. Left speaker 46, right speaker 48, and microphone 42 are shown on stereo headset 44. Stereo headset plug 50 comprises electrically-isolated ground conductor 52, microphone conductor 54, left audio conductor 56, and right audio conductor 58. When plugged into headset jack 14, ground conductor 52 is in contact with ground 24 of headset jack 14, microphone conductor 54 is in contact with microphone input 26 of headset jack 14, left audio conductor 56 is in contact with audio left output 28 of headset jack 14, and right audio conductor 58 is in contact with audio right output 60 of headset jack 14.

In the second embodiment of FIG. 2, resistances 62 and 64 are placed on both audio left and audio right output signal paths respectively in order to balance the audio output when headset driver 32 is driving a stereo headset. Resistance 62 is equal to resistance 64 so that audio left 28 and audio right 60 are both adjusted down by the same amplitude when driving a stereo headset. When driving a mono headset, such as that depicted in FIG. 1, the embodiment shown in FIG. 2 provides resistance 64 to audio right so that it is not shorted to ground.

In a third embodiment of the present invention, a detector is used to identify when a mono headset is plugged into the stereo headset jack of the playback device. When a mono headset is detected, audio right output is switched off, while audio left output remains on. The mono headset is then driven by audio left only. A mono headset has been plugged into the stereo headset jack when audio right has been grounded.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents.

What is claimed is:

1. An audio playback device interface for interface with an audio headset, said audio playback device comprising:

a first load resistance in series between an audio output of a stereo headset driver and a ground, wherein the first load resistance is configured to prevent the audio output from directly contacting the ground when a mono headset plug is inserted into the stereo headset driver to prevent damage to the stereo headset driver by providing a load that prevents the audio output from directly contacting the ground, the first load resistance configured to reduce current draw from a power supply corresponding to the playback device when a mono headset is plugged into a headset jack, wherein the first load resistance is at least equal to the minimum impedance that the stereo headset driver is configured to drive;

a second load resistance equal to the first load resistance, the second load resistance in series between a second audio output of a stereo headset driver and a stereo headset jack of an audio playback device; and a blocking capacitor disposed between the stereo headset driver and the first load resistance, wherein the blocking capacitor is configured to filter DC voltage from the stereo headset driver.

2. An audio playback device comprising:

a stereo headset driver for amplifying a first audio signal and a second audio signal to a headset;

a headset jack for contacting a headset plug in communication with a Headset, the headset jack in communication with output from the stereo headset driver;

a first load resistance between the headset jack and a first audio output from the stereo headset driver for preventing the first audio output from contacting a ground when a mono headset plug is inserted into the headset jack of the audio playback device to prevent damage to the stereo headset driver by providing a load that prevents the audio output from directly contacting the ground, wherein the first load resistance is configured to reduce current draw from a power supply corresponding to the playback device when the mono headset is plugged into the headset jack; and a blocking capacitor disposed between the stereo headset driver and the first load resistance, wherein the blocking capacitor is configured to filter DC voltage from the stereo headset driver.

3. The audio playback device of claim 2 wherein the first load resistance comprises a resistance in series between a first audio output from the stereo headset driver and the ground.

4. The audio playback device of claim 3 further comprising a second load resistance between the headset jack and a second audio output from the stereo headset driver.

5. The audio playback device of claim 4 wherein the second load resistance is equal to the first load resistance.

6. The audio playback device of claim 4 wherein the second load resistance comprises a resistance in series between a second audio output from the stereo headset driver and the headset jack.

7. A mobile communication device comprising:

a stereo headset driver for amplifying a first and a second audio signal to a headset;

a headset jack for contacting a headset plug in communication with a headset, the headset jack in communication with output from the stereo headset driver;

a load between said headset jack and a first audio output from the stereo headset driver for preventing a first audio output from contacting a ground when a mono headset plug is inserted into the stereo headset driver of the audio playback device to prevent damage to the stereo headset driver by providing a load that prevents the audio output from directly contacting the ground, wherein the load is configured to reduce current draw from a power supply corresponding to the playback device when the mono headset is plugged into the headset jack of the communication device; and a blocking capacitor disposed between the stereo headset driver and the load resistance, wherein the blocking capacitor is configured to filter DC voltage from the stereo headset driver.

8. A method of making a stereo audio playback device compatible with stereo and mono headsets comprising:

providing a headset driver for the audio playback device for amplifying a first audio signal and a second audio signal to a headset;

placing a first load resistance on a first audio output from the headset driver to prevent the first audio output from contacting a ground on a headset plug when a mono headset plug is inserted into a headset jack of the audio playback device to prevent damage to the stereo headset driver by providing a load that prevents the audio output from directly contacting the ground, wherein the first load resistance is configured to reduce current draw from a power supply corresponding to the playback device when the mono headset is plugged into the headset jack of the playback device;

placing a second load resistance between a second audio output from the headset driver and the headset jack of the audio playback device;

matching the values of the first load resistance and the second load resistance; and placing a capacitor between the headset driver and each load resistance, wherein the capacitor is configured to filter DC voltage from the headset driver.

9. The method of claim 8 wherein placing the first load resistance on the first audio output comprises placing the first load resistance in series between the first audio output from the stereo headset driver and the ground.

10. The method of claim 9 wherein placing the second load resistance on the second audio output comprises placing the second load resistance in series between the second audio output from the stereo headset driver and the headset jack.

11. The method of claim 10 wherein the first load resistance is equal to or greater than a minimum impendence or resistance that the headset driver is configured to drive.

* * * * *